United States Patent
Huang et al.

(10) Patent No.: US 8,921,978 B2
(45) Date of Patent: Dec. 30, 2014

(54) DUAL DNW ISOLATION STRUCTURE FOR REDUCING RF NOISE ON HIGH VOLTAGE SEMICONDUCTOR DEVICES

(75) Inventors: Chi-Feng Huang, Zhubei (TW); Chia-Chung Chen, Keelung (TW); Victor Chiang Liang, Hsinchu (TW); Hsiao-Chun Lee, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 13/347,031

(22) Filed: Jan. 10, 2012

(65) Prior Publication Data

US 2013/0175655 A1 Jul. 11, 2013

(51) Int. Cl.
H01L 21/70 (2006.01)

(52) U.S. Cl.
USPC ............... 257/550; 257/544; 257/E29.018; 257/E29.019

(58) Field of Classification Search
USPC ......... 257/335, 483, 484, 499, 503, 544, 550, 257/659, 660, E27.006, E29.019, 487, 500, 257/509, 545, 548, 549, 610, 611, 652, 257/E29.018, E21.54, E21.544, E21.63, 257/E21.642, E21.644
See application file for complete search history.

(56) References Cited

U.S. PATENT DOCUMENTS

| | | | | |
|---|---|---|---|---|
| 6,055,655 | A * | 4/2000 | Momohara | 714/723 |
| 6,133,079 | A * | 10/2000 | Zhu et al. | 438/210 |
| 6,274,909 | B1 * | 8/2001 | Chang et al. | 257/355 |
| 6,441,442 | B1 * | 8/2002 | Wong | 257/371 |
| 6,563,181 | B1 * | 5/2003 | Du et al. | 257/394 |
| 6,917,095 | B1 * | 7/2005 | Wong et al. | 257/548 |
| 7,057,241 | B2 * | 6/2006 | Ojala | 257/379 |
| 7,541,247 | B2 * | 6/2009 | Voldman | 438/294 |
| 7,923,807 | B2 * | 4/2011 | Nakamura | 257/505 |
| 8,324,707 | B2 * | 12/2012 | Sasaki et al. | 257/504 |
| 8,513,764 | B2 * | 8/2013 | Stribley et al. | 257/484 |
| 2003/0015759 | A1 * | 1/2003 | Davis | 257/368 |
| 2004/0195650 | A1 * | 10/2004 | Yang et al. | 257/531 |
| 2005/0116265 | A1 * | 6/2005 | Inoue et al. | 257/288 |
| 2007/0210404 | A1 * | 9/2007 | Umekita et al. | 257/499 |
| 2008/0061397 | A1 * | 3/2008 | Uchida | 257/508 |
| 2008/0237704 | A1 * | 10/2008 | Williams et al. | 257/338 |

(Continued)

OTHER PUBLICATIONS

Voldman, S.H. et al., "Guard Rings: Theory, Experimental Quantification and Design", Electrical Overstress/Electrostatic Discharge Symposium, Sep. 2005, 10 pages.

(Continued)

*Primary Examiner* — Eduardo A Rodela
(74) *Attorney, Agent, or Firm* — Duane Morris LLP; Mark J. Marcelli

(57) ABSTRACT

An isolation structure in a semiconductor device absorbs electronic noise and prevents substrate leakage currents from reaching other devices and signals. The isolation structure provides a duality of deep N-well ("DNW") isolation structures surrounding an RF device or other source of electronic noise. The DNW isolation structures extend into the substrate at a depth of at least about 2.5 μm and may be coupled to $V_{DD}$. P+ guard rings are also provided in some embodiments and are provided inside, outside or between the dual DNW isolation structures.

19 Claims, 4 Drawing Sheets

(56) References Cited

U.S. PATENT DOCUMENTS

2008/0272439 A1* 11/2008 Kapoor et al. ............... 257/369
2009/0090995 A1   4/2009 Yang et al.
2009/0140370 A1*  6/2009 Jou et al. .................... 257/487
2011/0062522 A1*  3/2011 Kato ........................... 257/355
2012/0187494 A1*  7/2012 Huang et al. ................ 257/368
2012/0228704 A1*  9/2012 Ju ............................... 257/339
2013/0062691 A1*  3/2013 Koo et al. .................... 257/335

OTHER PUBLICATIONS

Hsu, T.L. et al., "psub Guard Ring Design and Modeling for the Purpose of Substrate Noise Isolation in the SOC Era", IEEE Electron Device Letters, Sep. 2005, 26(9):693-695.

Niehenke, E. C. et al., "Microwave and Millimeter-Wave Integrated Circuits", IEEE Transactions on Microwave Theory and Techniques, Mar. 2002, 50(3):846-857.

* cited by examiner

US 8,921,978 B2

DUAL DNW ISOLATION STRUCTURE FOR REDUCING RF NOISE ON HIGH VOLTAGE SEMICONDUCTOR DEVICES

TECHNICAL FIELD

The disclosure is related to semiconductor devices and, more particularly, to deep N-well isolation structures that alleviate electronic noise.

BACKGROUND

RF semiconductor devices operate at high frequencies and generate electronic noise that can adversely affect other components of the circuit that includes the noise-generating device, other devices on the substrate including the circuit and other devices formed on other components in close vicinity to the noise. This is true for the various components that combine to form a package or other assemblies that include the RF device, and also for system on chip, SoC, technologies. The adverse affect upon other components is especially true for high voltage applications such as HVMOS (high voltage metal oxide semiconductor) devices. The noise source may be a device formed on a substrate and which operates at high, RF, frequencies, at high voltages or both. An inductor is another example of a device which can create electrical noise.

The noisy source such as an RF transmitter or RF receiver generates electric noise in the form of EM emissions that can propagate through air or other media such as the substrate itself. Continuous scaling of CMOS technology has resulted in chips operating at even higher frequencies with analog and digital circuits residing in the same chip at ever-closer distances especially in system-on-chip systems. Substrate noise coupling is an effect that is of concern because it can adversely affect the operation of various other devices. Substrate noise can couple into signals through metal routing, device junctions, or the substrate itself.

It would be desirable to isolate electronic noise and prevent it from coupling into other devices and other signals.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
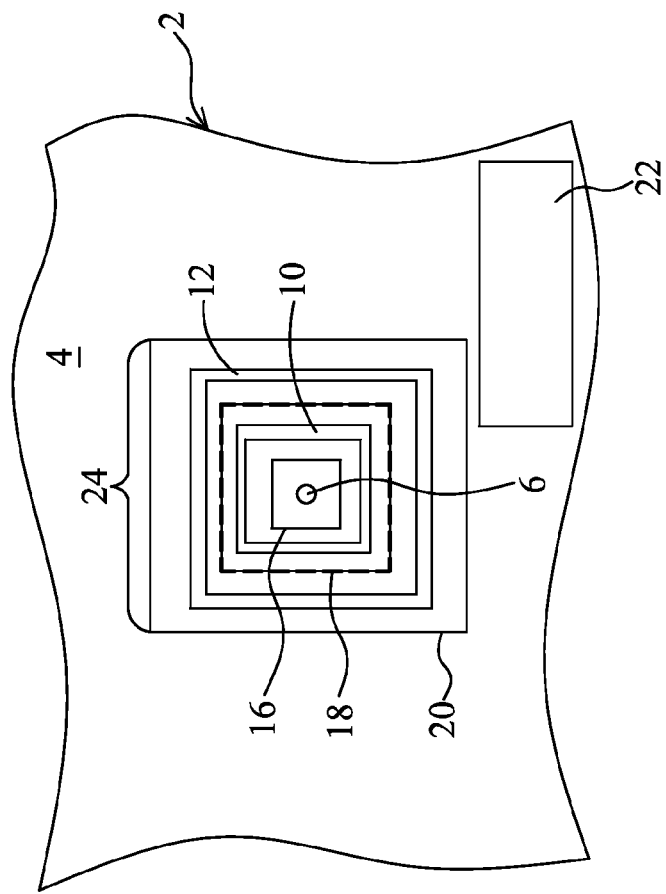
FIG. 1 is a top, plan view of an embodiment of a dual DNW isolation structure according to the disclosure.

According to various embodiments, the structure shown in FIG. 1 on substrate 2 is part of an integrated circuit or other semiconductor device that operates at high frequency and at high voltage and includes at least one source of electronic noise such as noise associated with RF operation or other EM (electromagnetic) noise. The integrated circuit also includes a multitude of other devices, signals and other features that are desired to be isolated from the electronic noise. In one embodiment, the structure shown in FIG. 1 is part of a system-on-chip integrated circuit that includes digital, analog, mixed-signal and radio frequency functions on a single chip substrate. In another embodiment, the system-on-chip integrated circuit includes less than all of the previously listed functions.

Radio frequency (RF) is a rate of oscillation in the range of about 3 kHz to 300 GHz, which corresponds to the frequency of radio waves, and the alternating currents which carry radio signals. Devices that operate in the RF range include currents that oscillate at radio frequencies. The energy in an RF current can radiate from a conductor into space in the form of electromagnetic waves, i.e. EM (electromagnetic) noise.

FIG. 1 is a top, plan view of a portion of a substrate including a noise source and illustrating an embodiment of an arrangement of a dual deep N-well ("DNW") isolation structure according to the disclosure. A portion of substrate 2 is shown. Substrate 2 is a semiconductor material. Substrate 2 is silicon in one embodiment. Substrate 2 is formed of other suitable semiconductor materials in other embodiments. The portion of substrate 2 shown in FIG. 1 represents a portion of an integrated circuit or other semiconductor device. In one embodiment, the integrated circuit is an HVMOS, (high voltage metal oxide semiconductor) semiconductor device.

In one embodiment, the high voltage semiconductor device operates at a voltage greater than about 3.3 volts. In one embodiment, the HVMOS operates at a voltage of about 5.0 volts or greater. The semiconductor device is an RF (radio frequency) semiconductor device in one embodiment, i.e. a device that operates at radio frequencies. In other embodiments, the semiconductor device is a device that operates at other high frequencies. In some embodiments, the RF semiconductor device is a portion of a system-on-chip integrated circuit that also includes mixed-signal, analog and digital portions.

Substrate 2 includes surface 4 and the illustrated features are formed in or on surface 4. In some embodiments, the described feature forms part of surface 4 and extends downwardly from surface 4. Noise source 6 is a structure from which electronic noise emanates. In one embodiment, the electronic noise is electromagnetic, EM, noise. The noise may be created by a transistor or other device operating at high voltage. In another embodiment, the noise is generated by a transistor or other device operating at high frequency such as an RF device. In another embodiment, the noise is generated by a transistor or other device operating at high voltage and at high frequency. In another embodiment, noise source 6 is an RF transmitter and/or receiver. In another embodiment, the noise is generated by a device coupled to noise source 6. In another embodiment, noise source 6 is an inductor structure formed on and/or in substrate surface 4.

Two deep N-well, DNW, isolation structures surround noise source 6. Inner DNW isolation structure 10 and outer DNW isolation structure 12 are shown. According to one embodiment, optional $P^+$ guard rings are also included. In the embodiment illustrated in FIG. 1, $P^+$ guard rings 16, 18 and 20 are shown. In other embodiments, a fewer or greater number of $P^+$ guard rings are used. In one embodiment, no $P^+$ guard rings are used. The relative positions of the $P^+$ guard rings and the DNW isolation structures is in accordance with one exemplary embodiment only. In other embodiments, the relative positions may differ. In one embodiment, there are two $P^+$ guard rings between inner DNW isolation structure 10 and outer DNW isolation structure 12. In one embodiment, there are two $P^+$ guard rings between noise source 6 and inner DNW isolation structure 10. In other embodiments, other numbers of P+ guard rings may be used and placed in various locations. In some embodiments, the P+ guard rings are coupled to ground.

The DNW isolation structures 10, 12 are disposed between noise source 6 and further devices formed peripherally outside outer DNW isolation structure 12. The two DNW isolation structures 10, 12 prevent electronic noise from noise source 6 from reaching device region 22 which contains other components that are desirably shielded from electronic noise. Inner and outer DNW isolation structures 10, 12 and optional P+ guard rings 16, 18, 20 may be collectively referred to as isolation structure 24. Isolation structure 24 advantageously prevents any leakage current emanating from noise source 6, from propagating outside isolation structure 24. In the illustrated embodiment, isolation structure 24 prevents leakage currents from extending to and adversely affecting devices in device region 22. Device region 22 is exemplary only and includes mixed signal/logic circuitry in one embodiment. In other embodiments, other device features are formed in various other locations outside of isolation structure 24 and will generally be formed in all locations of the semiconductor device.

Figure 2:
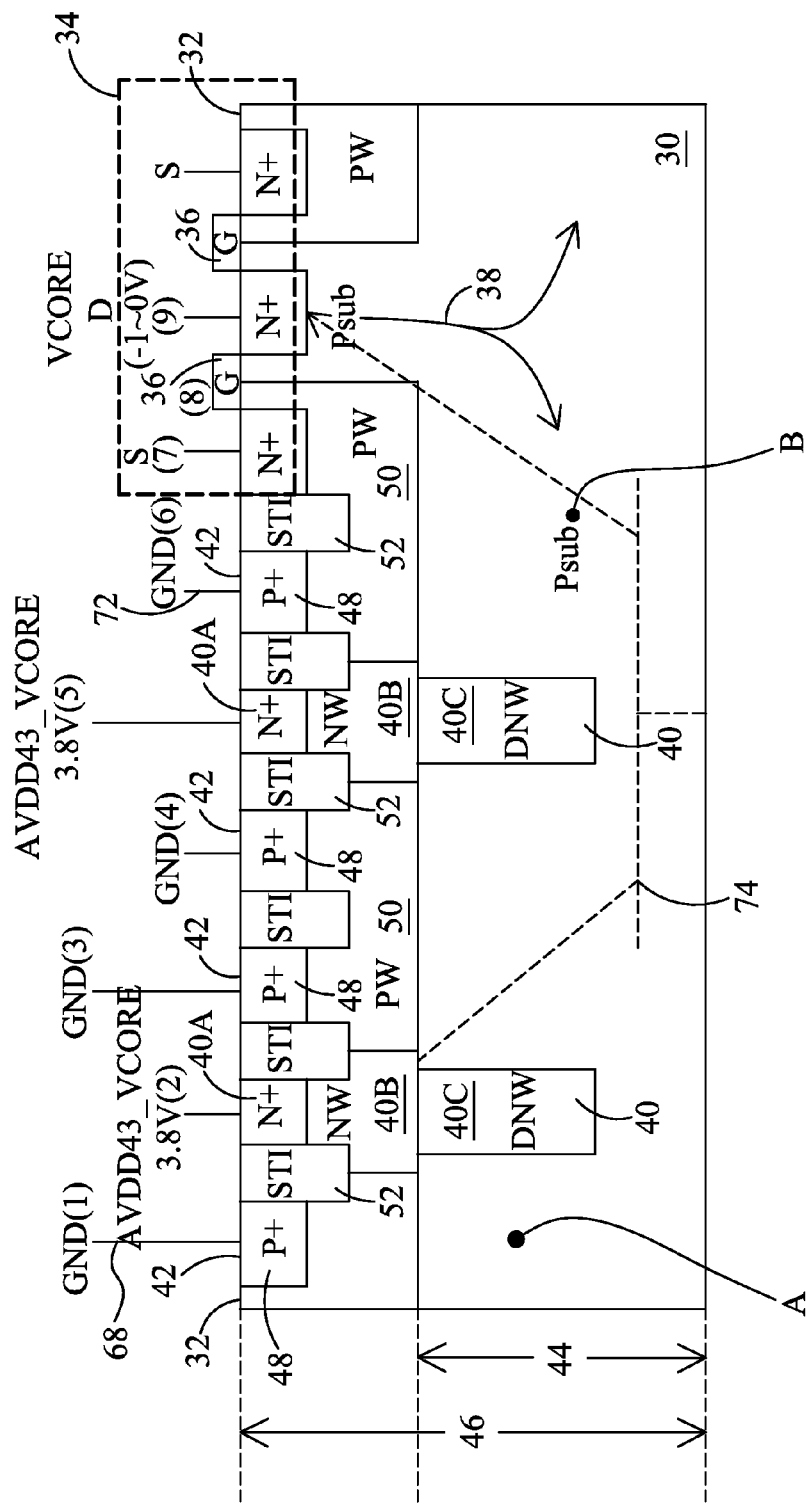
FIG. 2 is a cross-sectional view of an embodiment of a dual DNW isolation structure of the disclosure.

FIG. 2 is a cross-sectional view of an exemplary embodiment of a dual DNW isolation structure. Substrate 30 is a silicon substrate in one embodiment. Substrate 30 is formed of other suitable semiconductor materials in other embodiments. Substrate 30 is a P-type material in the illustrated embodiment. Substrate 30 includes substrate surface 32. Noise source 34 includes two transistors in the illustrated embodiment. The two transistors are characterized by transistor gates 36. The transistors may operate at high voltage, e.g. the transistors may operate at a voltage greater than about 3.3 volts in one embodiment. In another embodiment, the transistors may operate at a voltage greater than about 5.0 volts. The transistors may operate at radio frequency or may be coupled to an RF structure, not shown. In other embodiments, noise source 34 may be an inductor, an RF transmitter, an RF receiver, an RF transmitter and receiver, or other sources of electronic noise known in the art. In another embodiment, noise source 34 is coupled to or receives a signal from a source of electronic noise.

Leakage current 38 is shown schematically and represents an embodiment of a current path caused in substrate 30 as a result of electronic noise from noise source 34. Two DNW isolation structures 40 are present in the illustrated embodiment. Additional DNW isolation structures may be used in other embodiments. Four P+ guard rings 42 are also illustrated. In one embodiment, each of the two DNW isolation structures 40 and the four P+ guard rings 42 surround noise source 34 similar to the manner that DNW isolation structures 10 and 12 and P+ guard rings 16, 18 and 20 surround noise source 6 shown in FIG. 1.

Still referring to FIG. 2, DNW isolation structures 40 each include three portions. Each DNW isolation structure 40 includes upper N+ dopant impurity region 40A, N-well region 40B and deep N-well portion 40C. At least one of the DNW isolation structures 40 are coupled to $V_{DD}$, a positive supply voltage, in one embodiment. In one embodiment, DNW isolation structures 40 extend to a depth 46 of at least about 2.5 µm. In another embodiment, depth 46 may be 3 µm or greater. According to one embodiment, the combination of N+ dopant impurity region 40A and N-well region 40B may include a depth of about 0.5 to 1.5 µm with DNW portion 40C including a depth 44 beneath N-well structure 40B, of about 1.0 to about 3.0 µm. These dimensions are exemplary only. In other embodiments, the dimensions of the features will vary.

According to one embodiment, N-well region 40B may be formed using an implant energy in the range of about 150 to 500 KeV. In one embodiment, the dosage of the ion implantation may be about $1 \times 10^{12}$ to about $5 \times 10^{13}$ atoms/cm$^3$ in N-well region 40B According to one embodiment, DNW portion 40C may be formed using an implant energy in the range of about 600 to 1500 KeV. In one embodiment, the dosage of the ion implantation may be about $2 \times 13^{12}$ to about $1 \times 10^{14}$ atoms/cm$^3$ in DNW portion 40C.

In addition to the two DNW isolation regions 40, four optional P+ guard rings 42 are present and include P+ dopant impurity regions 48 that extend downwardly from substrate surface 32. P+ dopant impurity regions 48 are located above P-well regions 50. Shallow trench isolation ("STI") structures 52 isolate the oppositely doped (P or N) regions from one another along substrate surface 32. STI structures 52 are formed using various suitable techniques, many of which are known. FIG. 2 also illustrates that there are no additional noise sources between DNW isolation structures 40. The following regions are formed by introducing dopant impurities into a substrate: P+ dopant impurity regions 48, P-well regions 50, N+ dopant impurity regions 40A, N-well regions 40B and deep N-well portions 40C of DNW isolation structure 40. P-well region 50 and P+ dopant impurity regions 48 include P-type dopant impurities introduced into the semiconductor material of substrate 30. P type dopant impurities include boron, aluminum, gallium, indium, thallium, and unutrium. P+ dopant impurity regions 46 are identified as such to indicate that they include a higher dopant impurity concentration than P-well region 50. N-well regions 40B, deep N-well portions 40C and N+ dopant impurity regions 40A include N type dopant impurities introduced into the semiconductor material of substrate 30. N type dopant impurities include phosphorous, arsenic, antimony and bismuth. N+ dopant impurity regions 40A are identified as such to indicate that they include a higher dopant impurity concentration than N-well region 40B or deep N-well portions 40C. The "+" designation means a higher dopant impurity concentration than other regions of similar dopant impurities. In one embodiment, the "+" designation designates a dopant impurity concentration on the order of one dopant atom per 10,000 atoms but other dopant impurity atom concentrations are used in other exemplary embodiments. In one embodiment, N+ dopant impurity region 40A may include a dopant concentration of about 1×1014 to about 1×1016 atoms/cm$^3$. Known techniques may be used to form the aforementioned dopant impurity regions. Techniques for introducing dopant impurities into a substrate include ion implementation and thermal diffusion, but other techniques and methods are used in other embodiments.

Leakage current 38 is shown schematically and is produced by electronic noise from noise source 34. Leakage current 38 may propagate in various directions if not absorbed by one of the disclosed structures. In some embodiments, an aspect of the disclosure is the absorption of leakage current 38 by the two DNW isolation structures 40. DNW isolation structures 40 advantageously absorb leakage current such that leakage current at location A is significantly diminished with respect to leakage current at location B. In one embodiment, leakage current at location A is zero.

Optional P+ guard rings 42 formed of P+ dopant impurity regions 48 also absorb leakage current when present. In one embodiment, one or more of the P+ guard rings formed of P+ dopant impurity regions 48 is coupled to ground.

Still referring to FIG. 2, an aspect of the dual DNW isolation structures of the disclosure is that leakage current at node 68 will be less than leakage current at node 72 when noise source 34 operates due to the absorption of leakage current by the dual DNW isolation structures. Another advantageous aspect of the disclosure can be described in conjunction with dummy lateral BJT (bipolar junction transistor) 74 indicated by the dashed lines and presented for illustrative purposes to demonstrate current absorption aspects of the disclosure. The presence of DNW isolation structure 40, in particular the DNW isolation structure 40 located above BJT 74, absorbs current and thus limits current in the region of BJT 74. Any current that would flow from the emitter of the BJT to the base and also any minority carrier current that would be directed to the collector, would be suppressed due to the presence of N-well isolation structures 40. In embodiments without DNW isolation structures 40, BJT 74 would operate at higher speeds.

Figure 3:
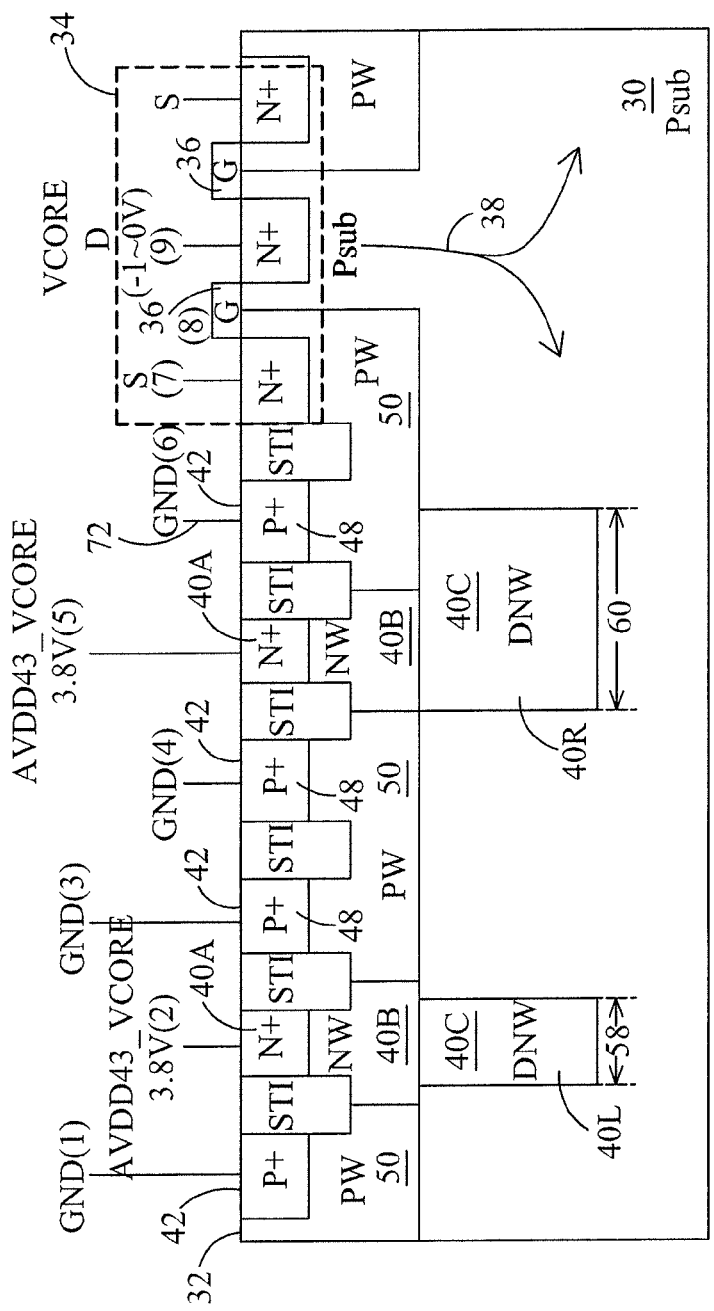
FIG. 3 is a cross-sectional view of another embodiment of a dual DNW isolation structure of the disclosure.
Figure 4:
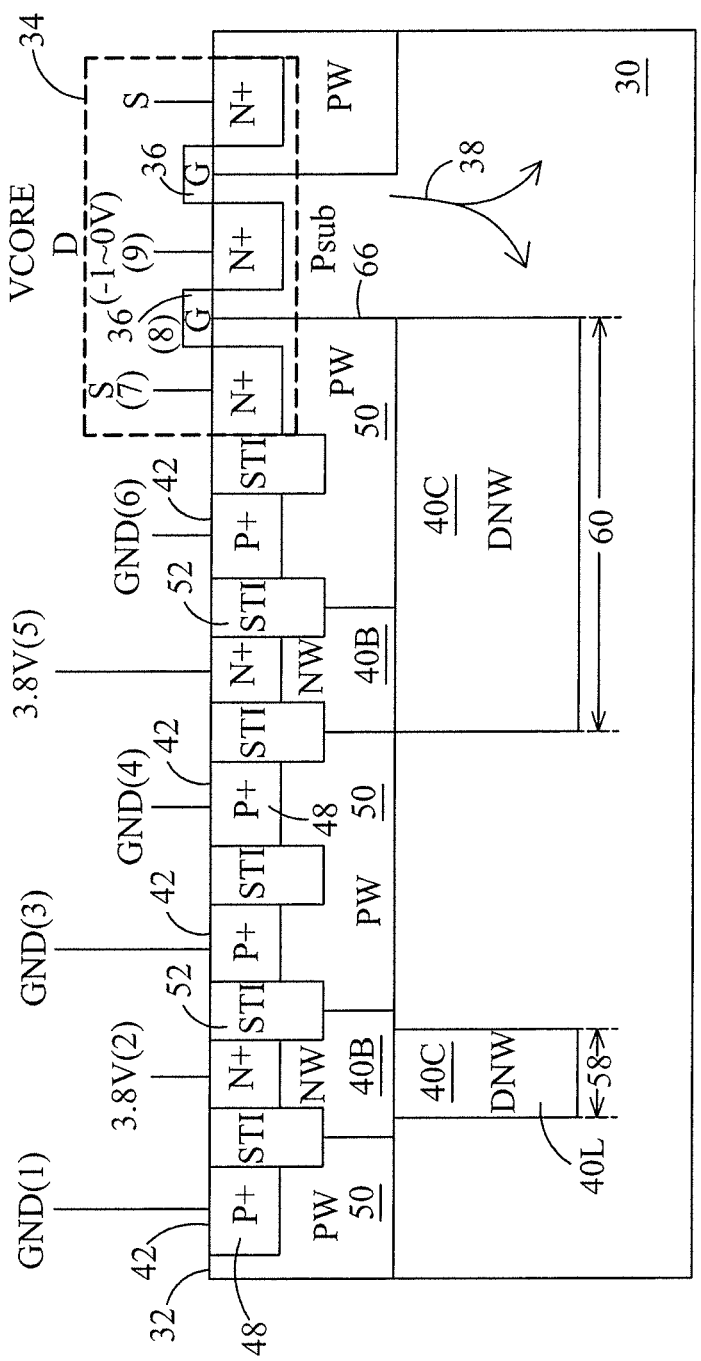
FIG. 4 is a cross-sectional view of another embodiment of a dual DNW isolation structure of the disclosure.

FIGS. 3 and 4 illustrate other embodiments of the dual DNW isolation structure arrangement according to the disclosure. FIGS. 3 and 4 illustrate that the DNW isolation structures can include different thicknesses, i.e. different widths in the illustrated embodiments which are shown in cross-section. FIGS. 3 and 4 show that DNW isolation structure 40R, on the right-hand side of the illustration and closer to noise source 34, is wider than DNW isolation structure 40L, on the left-hand side of the illustration. FIGS. 3 and 4 each illustrate that the wider DNW isolation structure 40R contacts P-well region 50 and extends at least partially laterally beneath P-well region 50. This further improves performance of the dual DNW isolation structure according to the disclosure. Successive implantation operations may be used to form the embodiments in FIGS. 3 and 4. Width 58 of DNW isolation structure 40L is about 1.5 µm in one embodiment. Other widths may be used in other embodiments. Width 60 of DNW isolation structure 40R may be about 2-5 times as great as width 58 of DNW isolation structure 40L in one embodiment. In one embodiment, width 60 is about 3-5 µm but other widths are used in other embodiments.

In the embodiment illustrated in FIG. 4, DNW isolation structure 40R extends substantially to the end 68 of P-well region 50 closest to the two transistors within noise source 34, further improving current absorption performance of the dual DNW isolation structures. In other embodiments, other relative widths are used and in some embodiments, the width of DNW isolation structure 40R on the right-hand side of the illustration is less than the width of DNW isolation structure 40L, on the left-hand side of the illustration and further from noise source 34.

Now returning to FIG. 1, according to the disclosed embodiments, leakage current that may be generated in substrate 2 due to noise source 6 is advantageously isolated through absorption in inner DNW isolation structure 10 and outer DNW isolation structure 12. In embodiments that also utilize optional P+ guard rings such as P+ guard rings 16, 18 and 20, the P+ guard rings additionally absorb leakage current and prevent leakage current from propagating outside isolation structure 24 shown in FIG. 1.

According to one aspect, a semiconductor device is provided. The semiconductor device includes: an RF device formed on a substrate; a first deep N-well (DNW) impurity region formed in the substrate and surrounding the RF device; and a second DNW impurity region formed in the substrate and surrounding the first DNW impurity region.

According to another aspect, a semiconductor device is provided. The semiconductor device includes: a substrate and including an electronic noise source formed on the substrate, the electronic noise source and including an electronic noise producing device disposed on the substrate at a first location or an electronic noise producing device coupled to the substrate at the first location. The semiconductor device also includes a first deep N-well (DNW) impurity region formed in the substrate and surrounding the first location; and a second DNW impurity region formed in the substrate and surrounding the first DNW impurity region.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor device comprising;
   an RF device formed on a substrate;
   a first deep N-well (DNW) impurity region formed in said substrate and laterally surrounding said RF device; and
   a second DNW impurity region formed in said substrate and laterally surrounding said first DNW impurity region,
   wherein no further RF devices are formed between said first DNW impurity region and said second DNW impurity region,
   wherein said second DNW dopant impurity region includes a width of about 2.0 µm and said first DNW dopant impurity region includes a width that is at least about 2 times as wide as said width of said second DNW dopant impurity region.

2. The semiconductor device as in claim 1, wherein said substrate comprises silicon and said first and second DNW impurity regions are laterally spaced apart from one another and each comprise an N-type dopant impurity region in a well region of said silicon substrate.

3. The semiconductor device as in claim 1, wherein each of said DNW impurity regions is coupled to $V_{DD}$.

4. The semiconductor device as in claim 1, further comprising at least one $P^+$ guard ring surrounding said RF device and disposed between said first DNW impurity region and said second DNW impurity region.

5. The semiconductor device as in claim 1, wherein said first and second DNW impurity regions each extend into said substrate to a depth of at least 3.0 µm beneath an upper surface of said substrate and further comprising a first $P^+$ guard ring formed in said substrate and surrounding said RF device and surrounded by said first DNW impurity region, a second $P^+$ guard ring formed in said substrate and surrounding said first DNW impurity region and surrounded by said second DNW impurity region, and a third $P^+$ guard ring formed in said substrate and surrounding said second DNW impurity region.

6. The semiconductor device as in claim 5, wherein each of said first, second and third $P^+$ guard rings is coupled to ground.

7. The semiconductor device as in claim 1, wherein said RF device comprises a transistor that operates at a voltage greater than 5 volts.

8. The semiconductor device as in claim 1, wherein said RF device comprises at least one of an RF transmitter and an RF receiver.

9. The semiconductor device as in claim 1, wherein:
said first and second DNW impurity regions each extend into said substrate to a depth of at least 3.0 µm beneath an upper surface of said substrate;
said first DNW dopant impurity region includes a width that is at least about 3 times as wide as a width of said second DNW dopant impurity region; and
said first DNW dopant impurity region extends at least partially laterally beneath a P-type impurity region.

10. The semiconductor device as in claim 1, further comprising mixed signal/logic circuitry formed on said substrate outside said second DNW dopant impurity region.

11. The semiconductor device as in claim 1, wherein each of said first and second DNW dopant impurity regions extends downwardly from a substrate surface of said substrate, and wherein each of said first and second DNW dopant impurity regions includes an $N^+$ isolation structure portion at said substrate surface.

12. The semiconductor device as in claim 1, wherein said first DNW dopant impurity region is laterally spaced apart from each of said second DNW dopant impurity region and said RF device.

13. The semiconductor device as in claim 1, wherein said semiconductor device comprises a system-on-chip integrated circuit that includes digital, analog, mixed-signal functions on said substrate.

14. A semiconductor device comprising;
an RF device formed on a substrate;
a first deep N-well (DNW) impurity region formed in said substrate and surrounding said RF device; and
a second DNW impurity region formed in said substrate and surrounding said first DNW impurity region,
wherein said first and second DNW impurity regions each extend into said substrate to a depth of at least 2.5 µm beneath an upper surface of said substrate, and each completely surround said RF device.

15. A semiconductor device comprising;
an RF device formed on a substrate;
a first deep N-well (DNW) impurity region formed in said substrate and laterally surrounding said RF device;
a second DNW impurity region formed in said substrate and laterally surrounding said first DNW impurity region; and,
at least one $P^+$ guard ring surrounding said RF device and disposed between said first DNW impurity region and said second DNW impurity region,
wherein said first and second DNW impurity regions each extend into said substrate to a depth of at least 2.5 µm beneath an upper surface of said substrate, and said at least one $P^+$ guard ring is coupled to ground and completely surrounds said RF device.

16. A semiconductor device comprising;
a substrate;
an electronic noise source formed on said substrate, said electronic noise source including an electronic noise producing device disposed on said substrate at a first location or an electronic noise producing device coupled to said substrate at said first location;
a first deep N-well (DNW) impurity region formed in said substrate and laterally surrounding said first location; and
a second DNW impurity region formed in said substrate and laterally surrounding said first DNW impurity region and no electronic noise source formed between said first DNW impurity region and said second DNW impurity region, each of said first and second DNW impurity regions defined by outer boundaries and consisting entirely of an N-doped region of said substrate between said outer boundaries,
wherein said first and second DNW impurity regions extend downwardly from a surface of said substrate to a DNW depth being greater than a depth of P-type impurity regions extending downwardly from said surface, each said P-type impurity region laterally separated from said first and second DNW impurity regions, and said electronic noise source is an RF device.

17. The semiconductor device as in claim 16, wherein said substrate comprises a P-type semiconductor substrate, each of said first and second DNW impurity regions extend into said substrate to a depth of at least 2.5 µm beneath an upper surface of said substrate and said electronic noise source is coupled to a voltage source of about 5 volts or greater.

18. The semiconductor device as in claim 16, wherein said first and second DNW impurity regions are coupled to $V_{DD}$ and wherein said semiconductor device is a system-on-chip device.

19. The semiconductor device as in claim 16, further comprising at least one $P^+$ guard ring surrounding said first location, and coupled to ground.

* * * * *